(12) United States Patent
Wu et al.

(10) Patent No.: US 7,154,724 B2
(45) Date of Patent: Dec. 26, 2006

(54) OUTPUT BUFFER ESD PROTECTION USING PARASITIC SCR PROTECTION CIRCUIT FOR CMOS VLSI INTEGRATED CIRCUITS

(75) Inventors: Yi-Hsun Wu, Hsin-Chu (TW); Jian-Hsing Lee, Hsin-chu (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 274 days.

(21) Appl. No.: 10/812,378

(22) Filed: Mar. 29, 2004

(65) Prior Publication Data

US 2005/0213274 A1    Sep. 29, 2005

(51) Int. Cl.
*H02H 9/04* (2006.01)
*H01L 23/62* (2006.01)

(52) U.S. Cl. ..................... 361/91.1; 257/355
(58) Field of Classification Search ............... 361/91.1; 257/355
See application file for complete search history.

(56) References Cited

U.S. PATENT DOCUMENTS

| | | | | |
|---|---|---|---|---|
| 5,473,169 A | * | 12/1995 | Ker et al. | ........ 257/173 |
| 6,066,879 A | * | 5/2000 | Lee et al. | ........ 257/355 |
| 6,309,940 B1 | * | 10/2001 | Lee | ........ 438/370 |
| 6,521,952 B1 | * | 2/2003 | Ker et al. | ........ 257/360 |
| 2003/0007301 A1 | * | 1/2003 | Ker et al. | ........ 361/111 |
| 2004/0100746 A1 | * | 5/2004 | Chen et al. | ........ 361/56 |

* cited by examiner

*Primary Examiner*—Stephen W. Jackson
*Assistant Examiner*—Scott Bauer
(74) *Attorney, Agent, or Firm*—Duane Morris, LLP

(57) ABSTRACT

An input and output (I/O) circuit with an improved ESD protection is disclosed. The circuit has an output buffer having an NMOS transistor coupled to a PMOS transistor, an ESD protection circuit having a parasitic silicon controlled rectifier (SCR) integrated therein and coupled to the output buffer, and a diode string having a predetermined number of diodes coupled between a source node of the NMOS transistor and ground, wherein a voltage drop across the diode string increases the SCR gate holding voltage, thereby setting an ESD protection holding voltage for the ESD protection circuit.

15 Claims, 4 Drawing Sheets

US 7,154,724 B2

OUTPUT BUFFER ESD PROTECTION USING PARASITIC SCR PROTECTION CIRCUIT FOR CMOS VLSI INTEGRATED CIRCUITS

BACKGROUND

The present disclosure relates generally to semiconductor devices; and more particularly, to protection of semiconductor devices from electrostatic discharge (ESD). Still more particularly, the present disclosure relates to the use of a parasitic lateral silicon controlled rectifier (SCR) ESD circuit to protect the output buffer circuit of an integrated circuit (IC) from damage caused by electrostatic discharge while preventing the output buffer circuit from a latch-up condition during normal circuit operation.

An integrated circuit (IC) contains semiconductor components (transistors) that can be damaged or destroyed by stray external electrical voltage pulses that are inadvertently discharged into the IC. It is understood that a regular supply voltage for ICs is typically 5.0, 3.3, 2.5, 1.8, 1.0 volts, or lower as specified by the IC manufacturer. Electrostatic voltages from common environmental sources can easily reach thousands, or even tens of thousands of volts. Such voltages are destructive even though the charge and any resulting current are extremely small. So, it is of critical importance to discharge any static electric charge, as it builds up, before it accumulates to a damaging voltage.

ESD protection circuitry added to the chip must allow normal operation of the IC. That means that the protection circuitry is effectively isolated from the normally operating integrated circuit core circuitry because it blocks current flow through itself to ground or any other circuit or pad. In an operating IC, electric power is supplied to a VCC pad, electric ground is supplied to a VSS pad, electronic signals are supplied from outside to internal IC pads, and electronic signals generated by the core circuitry of the IC are supplied to other internal IC pads for delivery to external circuits and devices. In an isolated, unconnected, IC all pads are considered to be electrically floating, or of indeterminant voltage. In most cases, that means that the pads are at ground, or zero, voltage.

ESD protection circuitry, therefore, has two states. In a normally operating IC, ESD protection circuitry appears invisible to the IC by blocking current through itself; and, thus, having no effect on the IC. In an isolated, unconnected IC, ESD protection circuitry serves its purpose of protecting the IC by conducting an electrostatic charge quickly to VSS ground before a damaging voltage can build up.

On-chip electrostatic discharge protection is essential in Complementary Metal-Oxide-Semiconductor (CMOS) integrated circuits. Generally, high failure threshold, small layout size, and low capacitance are required in the ESD protection circuit. As CMOS layouts are scaled down, the design of ESD protection circuits become increasingly more difficult.

It has been found that parasitic four-layer PNPN devices, also known as parasitic lateral Silicon Controlled Rectifiers (SCRs), are effective in preventing ESD damage to chips. Due to its high current sinking/sourcing capability, low turn-on impedance, low capacitance, and low power dissipation, the parasitic lateral SCR is one of the most effective devices in CMOS ESD protection. However, previous ESD circuits and methods have precluded the use of SCR in CMOS output buffer circuits due to SCR's low holding voltage (approximately 1~2V for sub-micron devices). This low holding voltage tends to latch up the buffer circuit, thereby preventing buffer circuit from operating normally. Without additional circuitry to higher the holding voltage, the parasitic lateral SCR may not be effective in ESD protection.

Desirable in the art of integrated circuit ESD protection are additional designs utilizing SCRs with an adjustable holding voltage that provides enhanced ESD protection, thereby improving IC life and reliability.

SUMMARY

According to the present invention, there is provided an on-chip electrostatic discharge (ESD) protection circuit and method.

In one embodiment, the circuit comprises an output buffer having an NMOS transistor coupled to a PMOS transistor, an ESD protection circuit having a parasitic silicon controlled rectifier (SCR) integrated therein and coupled to the output buffer, and a diode string having a predetermined number of diodes coupled between a source node of the NMOS transistor and ground, wherein a voltage drop across the diode string increases the SCR gate holding voltage, thereby setting an ESD protection holding voltage for the ESD protection circuit.

The construction and method of operation of the invention, however, together with additional objects and advantages thereof will be best understood from the following description of specific embodiments when read in connection with the accompanying drawings.

DESCRIPTION

In the present disclosure, an electrostatic discharge (ESD) protection circuit using a parasitic lateral SCR and the method for operating the same are disclosed. In some examples, the circuit incorporates dual asymmetric N-channel Metal-Oxide-Semiconductor (NMOS) transistors with two diode strings.

The use of a SCR alone as an ESD protection circuit may cause intermittent latch-up of the integrated circuit (IC) output buffer circuit due to the low SCR holding voltage. These SCRs typically have a low holding voltage which will be lower than that of the IC supply voltage, or VCC. Thus, during normal operation, the ESD protection circuit may trigger prematurely and disrupt the normal IC output buffer circuit operation. This disclosure provides an additional ESD performance enhancement, through the use of a parasitic lateral SCR with dual asymmetric NMOS transistors and diode strings, thereby eliminating the possibility of a latch-up condition in the IC output buffer circuit. The holding voltage of the ESD protection circuit is set such that only voltages greater than VCC enables the ESD protection circuit. Therefore, the ESD protection circuit remains disabled during the normal IC output buffer circuit operation and is enabled only when the input voltage exceeds the IC supply voltage VCC, such as during an ESD event.

Figure 1:
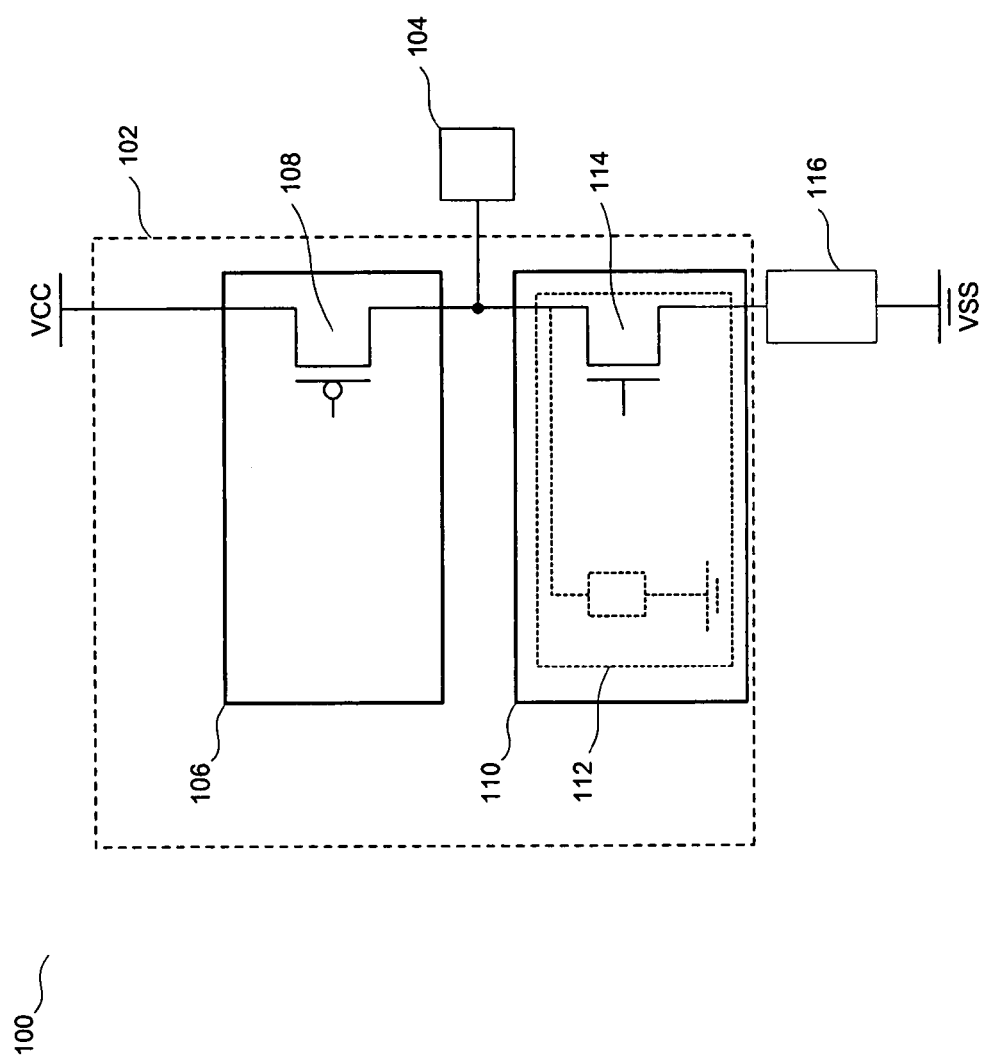
FIG. 1 presents a diagram illustrating a CMOS output buffer circuit with a parasitic lateral SCR structure providing ESD protection in accordance with one embodiment of the present disclosure.

FIG. 1 presents a diagram 100 illustrating a Complementary Metal-Oxide-Semiconductor (CMOS) input/output circuit (or more precisely, an output buffer circuit, in this example) with a parasitic lateral SCR structure in accordance with one example of the present disclosure. In other words, the diagram 100 is effectively a small segment of the total IC internal circuitry. Diagram 100 includes an output buffer circuit 102 and its connection to an I/O pad 104, which is connected to the IC external pins via a bond wire. The output buffer circuit 102 receives power from VCC and returns current through ground, or VSS.

The output buffer circuit 102 includes a P-channel Metal-Oxide-Semiconductor (PMOS) module 106, which includes a PMOS output transistor 108, and a NMOS module 110, which further includes a parasitic lateral SCR ESD protection circuit 112. The ESD protection circuit 112 further includes an NMOS output transistor 114. In connection with a diode string 116, the ESD protection circuit 112 provides a current path to discharge any ESD generated pulses to VSS prior to the degradation of the NMOS output transistor 114. In this example, diagram 100 is a simplified high level circuit diagram. In actual implementation at the fabrication level, two parallel asymmetric NMOS transistors may be utilized to form the NMOS transistor 114 in order to decrease the inherent capacitance, thereby increasing the circuit switching speed. With two NMOS transistors, two diode strings 116 may also be required, one for each NMOS transistor connection. This dual-transistor setup will be discussed in FIG. 2. Depending upon the VCC requirement, the length of the diode string 116 may be adjusted to adjust the SCR holding voltage threshold to an optimal level.

The ESD protection circuit 112 has its ESD protection holding voltage set by the SCR gate holding voltage, plus the voltage drop across the diode string 116. The voltage drop across the diode string 116 is determined by the number of diodes in the diode string 116. The number of diodes in the diode string is in turn dependent upon the IC supply voltage VCC specified for the IC as determined by the IC manufacturer.

During normal IC core circuit operation, the ESD protection circuit 112 should be disabled, and should have no effect on the integrated circuit core circuit operation. This is achieved by setting the holding voltage of the ESD protection circuit 112 slightly higher than VCC. When the input voltage is at or below VCC, the ESD protection circuit 112 does not reach its activation threshold and is, therefore, disabled. Thus, for a typical SCR gate holding voltage of 1.5V, diode forward voltage of 0.6V and VCC of:

VCC=1.8V, then 1 diode is required (1.5V+ 0.6V=2.1V)

VCC=2.5V, then 2 diodes are required (1.5V+ 1.2V=2.7V)

VCC=3.3V, then 4 diodes are required (1.5V+ 2.4V=3.9V)

If, on the other hand, the input voltage exceeds the supply voltage, as in an electrostatic discharge scenario, the SCR will trigger at the holding voltage point of the ESD protection circuit 112, thereby shorting ESD charge to ground, and thereby protecting the IC output buffer circuit NMOS transistor 114.

Figure 2:
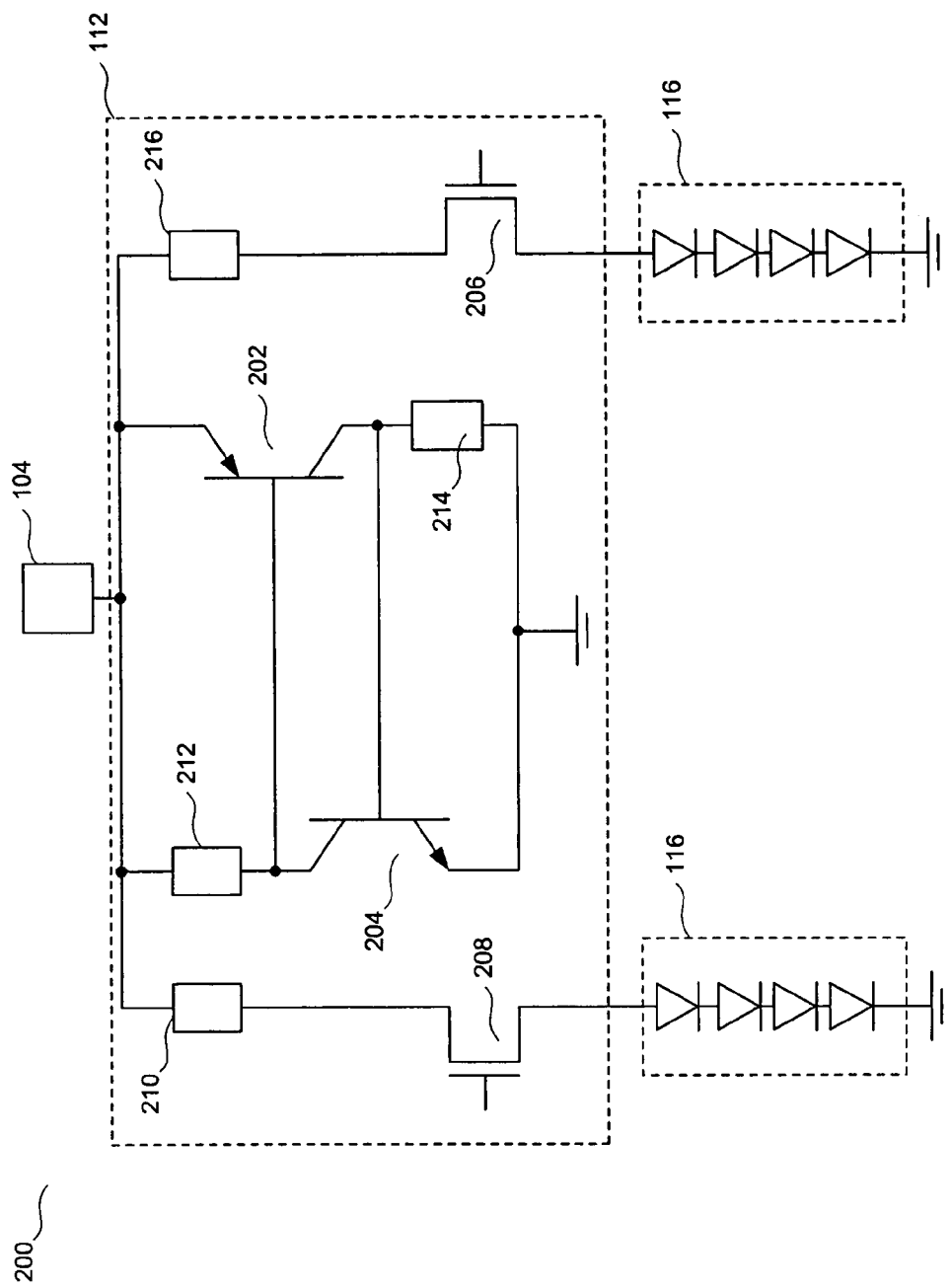
FIG. 2 illustrates a schematic of an exemplary implementation of an ESD protection circuit in accordance with the present invention.

FIG. 2 illustrates a circuit schematic 200 of the ESD protection circuit 112. With reference to FIGS. 1 and 2, the I/O pad 104 is connected to the IC external pins via a bond wire. The ESD protection circuit 112 is shown to be built by the PN junctions in CMOS semiconductor devices, and will be further discussed below.

The ESD protection circuit 112 includes a parasitic lateral PNP transistor 202 and a parasitic vertical NPN transistor 204. The pair of transistors effectively forms a parasitic lateral SCR structure that protects against positive ESD pulses. To further enhance the turn-on speed of the lateral SCR transistors 202 and 204 during a positive ESD transient, NMOS transistors 206 and 208 are used, respectively. The holding voltage of the NMOS transistors is dependent upon such process parameters as oxide thickness and the doping concentration under the oxide. These NMOS transistors may decrease the DC holding voltage of the lateral SCR structure. Resistors 210, 212, 214, and 216 are used as current limiting resistors for transistors 208, 204, 202, and 206, respectively. The two diode strings 116 are connected in a series with the sources of the NMOS transistors 206 and 208, respectively, and VSS. While it is shown that each diode string 116 has four diodes, it is understood by those skilled in the art that the number of series diodes may vary, depending on the holding voltage requirement for a particular output buffer scenario.

With reference to FIG. 1, and during normal circuit operation, current flows normally through the output buffer circuit transistors 108 and 114. Also, the IC output buffer circuit 102 receives power from VCC. During an abnormal scenario, such as an ESD event, the ESD protection circuit 112 activates, and effectively becomes a short circuit between the I/O pad 104 to VSS, thereby disposing the ESD charge through the protection circuit rather than through the IC output buffer transistor 114. As a result, the ESD protection circuit 112 protects the output buffer circuit 102 from excessive voltage or current anomalies that may cause circuit degradation or destruction.

When a positive ESD pulse occurs that is greater than the parasitic lateral SCR trigger voltage at the I/O pad 104, the PNP transistor 202 starts to turn on because of the forward voltage on its emitter-base junction. The current flowing through the PNP transistor 202 and resistor 214 creates a voltage across the resistor 214 that forward biases the NPN transistor 204 to completely turn on the parasitic lateral SCR structure 112. In addition, the dual asymmetric NMOS transistors 206 and 208 are used to enhance the turn-on speed of the ESD protection circuit 112. As soon as the ESD protection circuit 112 is activated, the positive ESD pulse is quickly discharged through the low impedance path of this circuit. After the positive ESD pulse, transistors 202, 204, 206, and 208 turn off. The turn-on speed of the ESD protection circuit 112 may also be enhanced by increasing the beta-gain product of transistors 202 and 204, and the resistance of the resistor 214.

The ESD protection circuit 112 is activated when the voltage at the I/O pad 104 rises above a preset voltage (e.g., during an ESD event). This sudden rise in voltage, in turn, supplies a sufficient SCR gate current (approximately 50 mA in this example) to trigger the SCR. The holding voltage of the ESD protection circuit 112 is preset by the holding voltage of the SCR, plus the voltage drop across the diode string. The series diode voltage drop is dependent upon the number of diodes in the string.

The switching speed of the ESD protection circuit 112 from a disabled state to a full short circuit condition that protects the IC core circuitry is critical. If the ESD protection circuit is too slow in responding to an ESD voltage spike, then a portion of the voltage spike will appear on the IC output buffer circuit transistor 114, thereby degrading or even destroying the circuit. Therefore, the capacitance of the discharge path must be kept to a minimum. The capacitance of this ESD circuit may be minimized by minimizing the physical layout size of the dual asymmetric NMOS transistors 206 and 208.

Figure 3:
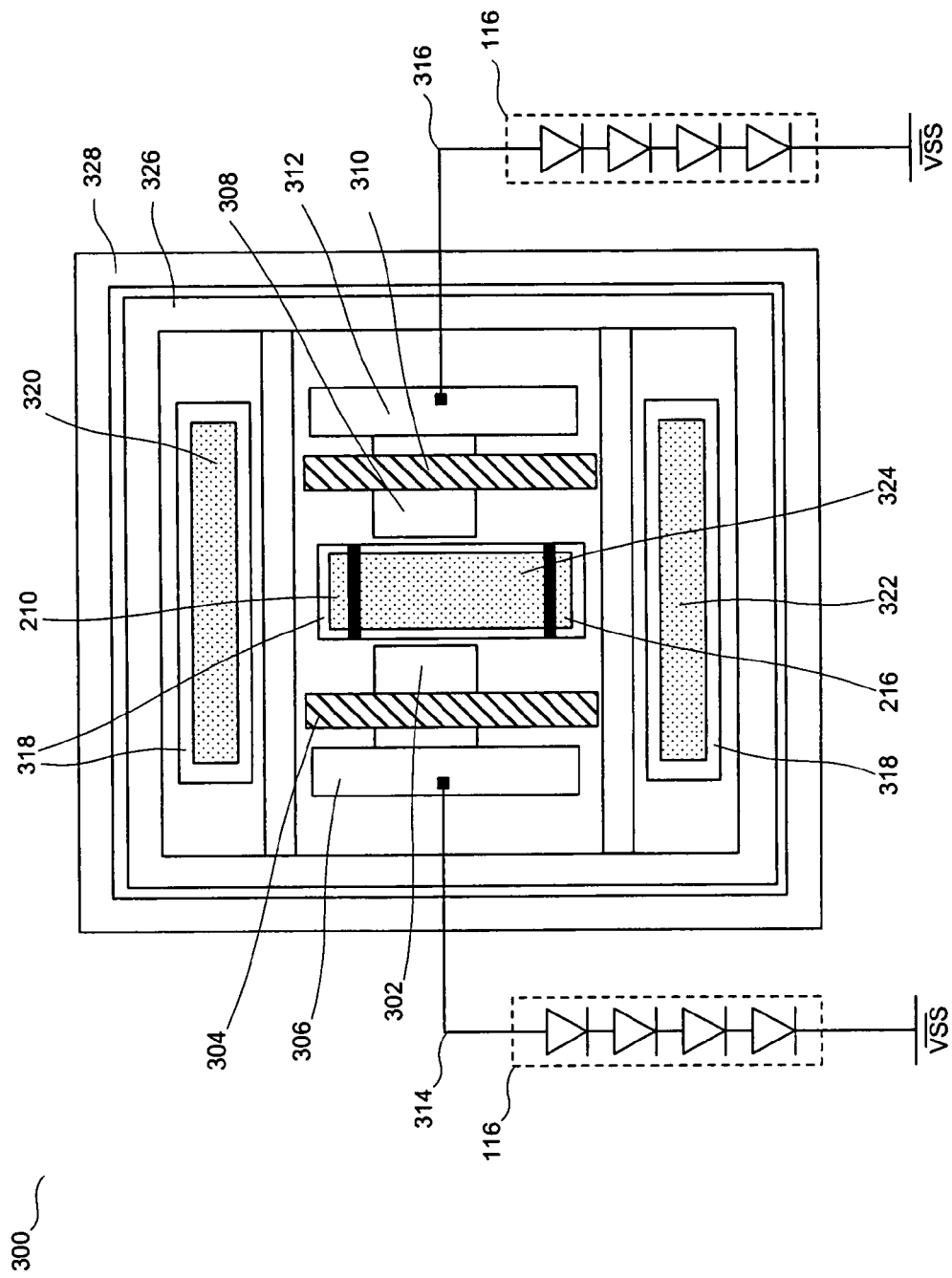
FIG. 3 illustrates a physical layout and implementation of the exemplary ESD protection circuit illustrated in FIG. 2.

FIG. 3 illustrates a simplified physical layout 300 of the ESD protection circuit 112. With reference to FIGS. 2 and 3, the drain, the gate, and the source of NMOS transistor 206 are formed by areas 302, 304 and 306, respectively. With further reference to FIGS. 2 and 3, the drain, the gate, and the source of NMOS transistor 208 are formed by areas 308, 310 and 312, respectively. The drains of the parallel NMOS transistors 206 and 208 are tied to resistors 210 and 216, respectively. The source of the NMOS transistor 206, or the area 306, is tied to the anode of the first diode string 116 via a line 314. The source of the NMOS transistor 208, or the area 312, is tied to the anode of the second diode string 116 via a line 316. The cathode of both diode strings 116 are tied to VSS. N wells are formed as shown in area 318. N+ material is deposited in the N wells at 320 and 322 and P+ material is deposited in the N well as shown in area 324. The I/O pad 104 connects with N+ deposits 320 and 322, and P+ deposit 324. The layout 300 shows two effective minority carrier guard rings: PMOS guard ring 326 and NMOS guard ring 328. The PMOS guard ring 326 is connected to substrate potential VSS to reverse-bias the PMOS-N-well junction. This guard ring collects a percentage of the injected minority carriers of the enclosed PMOS transistor. The N moat guard 328 is connected to a positive supply VCC to help drive the depletion region deeper into the substrate to enhance collection efficiency.

Figure 4:
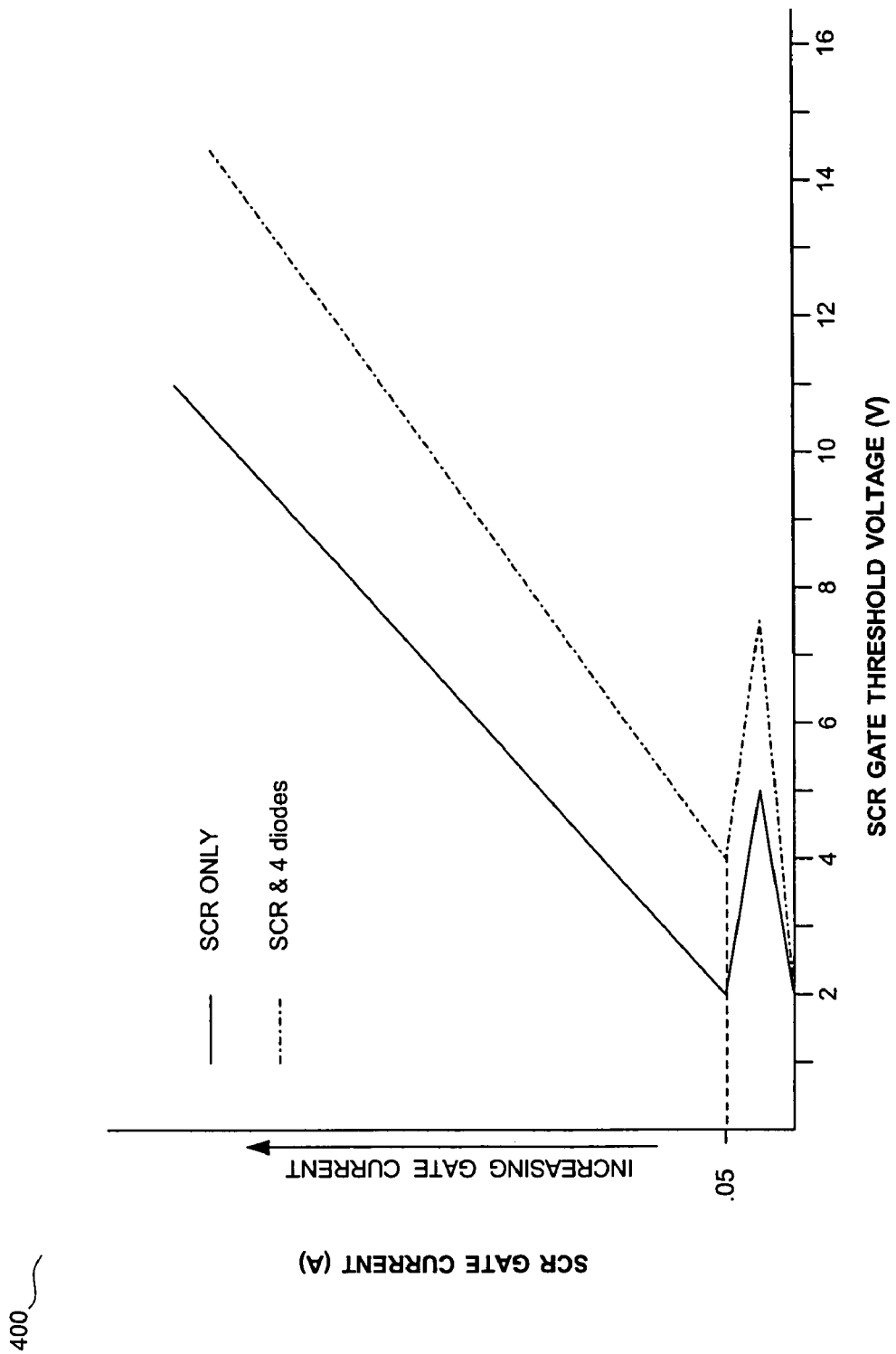
FIG. 4 presents a graph illustrating relationships between SCR gate holding voltage and SCR gate current in two different diode strings of an ESD protection circuit in accordance with the present invention.

FIG. 4 presents a graph 400 illustrating the relationships between SCR holding voltage and SCR current in two different diode string setups. For both relationships, the SCR voltage will increase until the current increases to the point where the SCR triggers. The SCR current trigger point in both setups is approximately 50 mA. As more diodes are added in the diode string, the SCR current reaches the trigger point of 50 mA with larger SCR holding voltages.

As illustrated above, the incorporation of the parasitic lateral SCR with the dual asymmetric NMOS devices permit a low SCR holding voltage. The holding voltage of the ESD protection circuit may be further adjusted by the addition of diodes in the two diode strings. When the holding voltage of the ESD protection circuit is set slightly higher than the manufacturer's selected VCC, the ESD protection circuit will not activate under normal operating conditions, but will activate when an ESD event occurs.

The above disclosure provides many different embodiments or examples for implementing different features of the disclosure. Specific examples of components and processes are described to help clarify the disclosure. These are, of course, merely examples and are not intended to limit the disclosure from that described in the claims.

Although illustrative embodiments of the disclosure have been shown and described, other modifications, changes, and substitutions are intended in the foregoing disclosure. Accordingly, it is appropriate that the appended claims be construed broadly and in a manner consistent with the scope of the disclosure, as set forth in the following claims.

What is claimed is:

1. An input and output (I/O) circuit comprising:
    an output buffer having an NMOS transistor coupled to a PMOS transistor;
    an ESD protection circuit having a parasitic silicon controlled rectifier (SCR) integrated therein, and coupled to the output buffer; and
    a diode string having a predetermined number of diodes coupled between a source node of the NMOS transistor and ground,
    wherein a voltage drop across the diode string increases the SCR holding voltage, thereby setting an ESD protection holding voltage for the ESD protection circuit, wherein the NMOS transistor is realized by using two asymmetric NMOS transistors.

2. The circuit of claim 1 wherein the number of the diodes in the diode string is determined by a positive supply voltage and the SCR holding voltage.

3. The circuit of claim 1 wherein the SCR has an increased beta-gain product of two transistors therein.

4. The circuit of claim 1 wherein the diode string has two or fewer diodes for a positive supply voltage of about 2.5V or less.

5. The circuit of claim 1 wherein the diode string has four, or fewer diodes, for a positive supply voltage of about 3.3V or less.

6. An input and output (I/O) circuit comprising:
    an output buffer having an NMOS transistor coupled to a PMOS transistor;
    an ESD protection circuit having a parasitic silicon controlled rectifier (SCR) integrated therein and coupled to the output buffer; and
    a diode string having four, or fewer diodes, coupled between a source node of the NMOS transistor and ground,
    wherein a voltage drop across the diode string increases the SCR holding voltage, thereby setting an ESD protection holding voltage for the ESD protection circuit, wherein the NMOS transistor is realized by using two asymmetric NMOS transistors.

7. The circuit of claim 6 wherein the number of the diodes in the diode string is determined by a positive supply voltage and the SCR gate holding voltage.

8. The circuit of claim 6 wherein the SCR has an increased beta-gain product of two transistors therein.

9. A layout for an output buffer having an NMOS transistor comprising:
    a N well region having a P+ region contained therein; and
    two asymmetrical NMOS transistors formed on two sides of the P+ region;
    wherein a portion of the P+ region in the N well region provides at least one resistor for a parasitic silicon controlled rectifier (SCR), and
    wherein a diode string having a predetermined number of diodes is coupled between a source node of the NMOS transistors and ground.

10. The layout of claim 9 wherein the number of the diodes in the diode string is determined by a positive supply voltage and the SCR gate holding voltage.

11. The layout of claim 9 wherein the SCR has an increased beta-gain product of two transistors therein.

12. The layout of claim 9 wherein the diode string has two or fewer diodes for a positive supply voltage of about 2.5V or less.

13. The layout of claim 9 wherein the diode string has four, or fewer diodes, for a positive supply voltage of about 3.3V or less.

14. The layout of claim 9 further comprising one or more guard rings for collecting minority carriers.

15. The layout of claim 9 wherein a center portion of the P+ region is connected to an input/output pad.

* * * * *